United States Patent
Sharma et al.

(10) Patent No.: US 7,031,870 B2
(45) Date of Patent: Apr. 18, 2006

(54) DATA CENTER EVALUATION USING AN AIR RE-CIRCULATION INDEX

(75) Inventors: Ratnesh K. Sharma, Union City, CA (US); Cullen E. Bash, San Francisco, CA (US); Chandrakant D. Patel, Fremont, CA (US)

(73) Assignee: Hewlett-Packard Development Company, L.P., Houston, TX (US)

( * ) Notice: Subject to any disclaimer, the term of this patent is extended or adjusted under 35 U.S.C. 154(b) by 126 days.

(21) Appl. No.: 10/855,400

(22) Filed: May 28, 2004

(65) Prior Publication Data

US 2005/0267639 A1    Dec. 1, 2005

(51) Int. Cl.
*G01K 1/00* (2006.01)
*G01K 11/00* (2006.01)
(52) U.S. Cl. ..................................................... 702/130
(58) Field of Classification Search ................. 702/130
See application file for complete search history.

(56) References Cited

U.S. PATENT DOCUMENTS

2003/0139894 A1 * 7/2003 Ryan et al. .................. 702/132
2005/0187664 A1 * 8/2005 Bash et al. .................. 700/276
2005/0228618 A1 * 10/2005 Patel et al. .................. 702/188

* cited by examiner

*Primary Examiner*—John Barlow
*Assistant Examiner*—Demetrius R. Pretlow
(74) *Attorney, Agent, or Firm*—Richard P. Lange

(57) ABSTRACT

In a method for evaluating one or more components in a data center, inlet and outlet temperatures of one or more heat dissipating devices are detected. In addition, the temperatures of air supplied by one or more computer room air conditioning (CRAC) units are also detected. Indices of air re-circulation for the one or more heat dissipating devices are calculated based upon the detected inlet temperatures, outlet temperatures and supplied air temperatures. The indices of air re-circulation are determined at various flow field settings of air delivered to the one or more heat dissipating devices and the one or more components are evaluated based upon changes in the indices of air re-circulation for the one or more heat dissipating devices at the various flow field settings.

41 Claims, 9 Drawing Sheets

DATA CENTER EVALUATION USING AN AIR RE-CIRCULATION INDEX

BACKGROUND OF THE INVENTION

A data center may be defined as a location, for instance, a room, that houses computer systems arranged in a number of racks. A standard rack, for example, an electronics cabinet, is defined as an Electronics Industry Association (EIA) enclosure, 78 in. (2 meters) high, 24 in. (0.61 meter) wide and 30 in. (0.76 meter) deep. These racks are configured to house a number of computer systems, about forty (40) systems, with future configurations of racks being designed to accommodate 200 or more systems. The computer systems typically include a number of printed circuit boards (PCBs), mass storage devices, power supplies, processors, micro-controllers, and semi-conductor devices, that dissipate relatively significant amounts of heat during their operation. For example, a typical computer system comprising multiple microprocessors dissipates approximately 250 W of power. Thus, a rack containing forty (40) computer systems of this type dissipates approximately 10 KW of power.

The power required to transfer the heat dissipated by the components in the racks to the cool air contained in the data center is generally equal to about 10 percent of the power needed to operate the components. However, the power required to remove the heat dissipated by a plurality of racks in a data center is generally equal to about 50 percent of the power needed to operate the components in the racks. The disparity in the amount of power required to dissipate the various heat loads between racks and data centers stems from, for example, the additional thermodynamic work needed in the data center to cool the air. In one respect, racks are typically cooled with fans that operate to move cooling air across the heat dissipating components; whereas, data centers often implement reverse power cycles to cool heated return air. The additional work required to achieve the temperature reduction, in addition to the work associated with moving the cooling fluid in the data center and the condenser, often add up to the 50 percent power requirement. As such, the cooling of data centers presents problems in addition to those faced with the cooling of the racks.

Conventional data centers are typically cooled by operation of one or more computer room air conditioning (CRAC) units. For example, compressors of CRAC units typically consume a minimum of about thirty (30) percent of the required operating energy to sufficiently cool the data centers. The other components, for example, condensers and air movers (fans), typically consume an additional twenty (20) percent of the required total operating energy. As an example, a high density data center with 100 racks, each rack having a maximum power dissipation of 10 KW, generally requires 1 MW of cooling capacity. CRAC units with a capacity of 1 MW of heat removal generally requires a minimum of 300 KW input compressor power in addition to the power needed to drive the air moving devices, for instance, fans and blowers. Conventional data center CRAC units do not vary their cooling fluid output based on the distributed needs of the data center. Instead, these CRAC units generally operate at or near a maximum compressor power level even when the heat load is reduced inside the data center.

The substantially continuous operation of the CRAC units is generally designed to operate according to a worst-case scenario. For example, CRAC units are typically designed around the maximum capacity and redundancies are utilized so that the data center may remain on-line on a substantially continual basis. However, the computer systems in the data center may only utilize around 30–50% of the maximum cooling capacity. In this respect, conventional cooling systems often attempt to cool components that may not be operating at a level which may cause their temperatures to exceed a predetermined temperature range. Consequently, many conventional cooling systems often incur greater amounts of operating expenses than may be necessary to sufficiently cool the heat generating components contained in the racks of data centers.

Other types of conventional CRAC units are configured to vary the temperature of the cooling fluid as well as the volume flow rate of the cooling fluid supplied into the data center. These types of CRAC units often include cooling systems configured to vary the temperature of the received cooling fluid prior to delivery into the data center. The cooling systems include variable capacity compressors and chilled water systems. In addition, these CRAC units also include blowers with variable frequency drives configured to vary the volume flow rate of the cooling fluid delivered into the data center.

Conventionally, data centers are initially designed based upon uniform criteria for thermal management irrespective of rack configuration and power density. In this regard, data centers are typically designed without regard to the effects of heterogeneous heat loads and airflow. Instead, data centers are typically designed based upon intuition as the primary tool to guide the placement and re-arrangement of data center cooling infrastructures and resources. Consequently, conventional data centers oftentimes have infrastructures that are not efficiently designed for varying heat loads and airflows. In this regard, the energy required to cool the components contained in the racks is usually consumed in inefficient manners as additional energy is required to compensate for the non-optimized data center layouts.

SUMMARY OF THE INVENTION

In a method for evaluating one or more components in a data center, inlet and outlet temperatures of one or more heat dissipating devices are detected. In addition, the temperatures of air supplied by one or more computer room air conditioning (CRAC) units are also detected. Indices of air re-circulation for the one or more heat dissipating devices are calculated based upon the detected inlet temperatures, outlet temperatures and supplied air temperatures. The indices of air re-circulation are determined at various flow field settings of air delivered to the one or more heat dissipating devices and the one or more components are evaluated based upon changes in the indices of air re-circulation for the one or more heat dissipating devices at the various flow field settings.

BRIEF DESCRIPTION OF THE DRAWINGS

Features of the present invention will become apparent to those skilled in the art from the following description with reference to the figures, in which.

DETAILED DESCRIPTION OF THE INVENTION

Figure 1A:
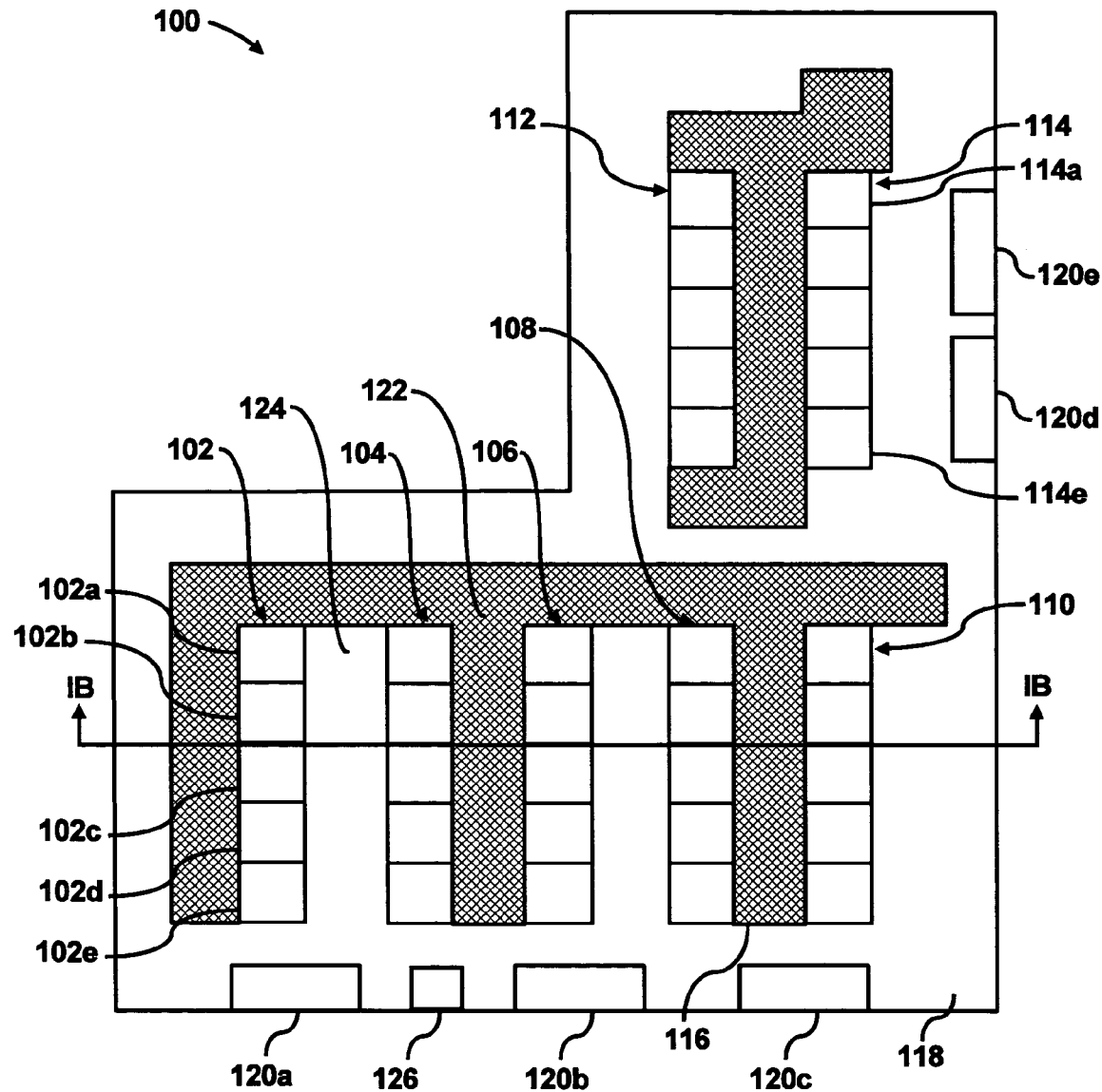
FIG. 1A shows a simplified plan view of a data center, according to an embodiment.

For simplicity and illustrative purposes, the present invention is described by referring mainly to an exemplary embodiment thereof. In the following description, numerous specific details are set forth in order to provide a thorough understanding of the present invention. It will be apparent however, to one of ordinary skill in the art, that the present invention may be practiced without limitation to these specific details. In other instances, well known methods and structures have not been described in detail so as not to unnecessarily obscure the present invention.

An index of air re-circulation is employed for various purposes in at least one of the layout design, deployment, and evaluation of data centers. In one respect, various air re-circulation indices are calculated for various flow field settings. The flow field settings may include, for instance, the volume flow rates of one or more CRAC units, the airflow characteristics through one or more vent tiles, the positions of adjustable panels or adjustable louvers configured to vary airflow into individual racks, the speeds of rack-mounted fans, etc. In addition, the one or more vent tiles may be positioned on a raised floor, a lowered ceiling, a delivery point of a ducted supply network, a return point of a ducted return network, etc. The calculated indices are plotted against inlet temperatures at various racks to determine how the indices vary with different flow field settings. In addition, the plotted relationships are examined to determine whether a linear relationship exists. Depending upon the linearity, or lack of linearity, airflow characteristics in a data center may be characterized. For instance, if it is determined that the airflow characteristics in the data center are substantially optimized, a determination that the data center infrastructure need not be modified may be made. Otherwise, if the airflow characteristics in the data center are not substantially optimized, a determination that the data center infrastructure requires modification may be made.

The index of air re-circulation may also be employed as a tool for evaluating CRAC unit influence to various areas of the data center. The various areas in the data center may include any reasonably suitable heat dissipating device or groups of heat dissipating devices, such as, for instance, racks, monitors, or other devices. In this example, correlations between air re-circulation indices and various flow rates of air supplied by one or more CRAC units may be employed to determine the influence of the one or more CRAC units to the various areas in the data center.

The index of air re-circulation may further be employed as a tool for evaluating air flow through various heat dissipating devices, such as, for instance, racks, monitors or other devices. In one regard, the manner in which the re-circulation of air varies at various racks in response to changing one or more flow field settings may be used to evaluate the airflow characteristics of the various racks.

Although reference is made throughout the present disclosure to racks, it should be understood that various aspects of the invention may be practiced with or on other types of heat dissipating devices. In this regard, it should be understood that the discussion of racks in the present disclosure is not meant to limit the invention, but that such discussion is made for purposes of simplicity of description.

With reference first to FIG. 1A, there is shown a simplified plan view of a data center 100, according to an embodiment. The terms "data center" are generally meant to denote a room or other space and are not meant to limit the invention to any specific type of room where data is communicated or processed, nor should it be construed that use of the terms "data center" limits the invention in any respect other than its definition hereinabove.

As shown in the FIG. 1A, the data center 100 includes a plurality of rows of racks 102–114, for instance, electronics cabinets, generally positioned in substantially parallel rows. Each of row of racks 102–114 is illustrated as containing five racks. With reference to the row of racks 102, the racks forming the row of racks 102–114 are depicted as including racks 102a–102e. The racks contained in each of the rows of racks 102–114 house one or more components (not shown). These components may include, for instance, computers, servers, monitors, hard drives, disk drives, etc., designed to perform various operations. Some operations of the components may include, for instance, computing, switching, routing, displaying, etc. These components may comprise subsystems (not shown), for example, processors, microcontrollers, high-speed video cards, memories, semiconductor devices, and the like to perform these functions. In the performance of these electronic functions, the components, and therefore the subsystems, generally dissipate relatively large amounts of heat. Because racks have been known to include upwards of forty (40) or more subsystems, they may dissipate substantially large amounts of heat. Cooled air, or other type of fluid for cooling the components, is therefore supplied to generally flow around and through the components to absorb the dissipated heat through convection, to maintain the subsystems and the components generally within predetermined operating temperature ranges.

The cooled air is illustrated as being supplied through vent tiles 116 in the floor 118 of the data center 100. The vent tiles 116 are illustrated as being variously positioned to supply cooled air to the racks 102a–114e. As will be seen in FIG. 1B, the floor 118 is a raised floor with a space therebelow. The space generally enables power lines, communication lines, and other wires (not shown), to be located below the floor 118 such that the wires and communication lines are substantially positioned away from an upper surface of the floor 118. The space may also function as a plenum for delivery of cooled air from variously positioned computer room air conditioner (CRAC) units 120a–120e to the racks 102a–114e.

As shown in FIG. 1A, the CRAC units 120a–120e are positioned to supply cooled air to various regions of the data center 100. In addition, some of the cooled air delivered to certain sections of the data center 100 may include cooled air supplied by more than one CRAC unit 120a–120e.

The aisles 122 between the racks 102a–114e having vent tiles 116 located therebetween may be considered as cool aisles. These aisles 122 are considered "cool aisles" because they are configured to receive cooled air from the vent tiles 116. The aisles 124 between the racks 102a–114e that do not have vent tiles 116 may be considered as hot aisles because they are positioned to receive air that has been heated by the components in the racks 102a–114e.

Also illustrated in FIG. 1A is a computing device 126. The computing device 126 may comprise a computer system, a controller, microprocessor, etc., configured to control operations of one or more of the CRAC units 120a–120e. More particularly, the computing device 126 may be configured, for instance, to receive input from sensors (not shown) and to vary operations of the various variable controllable systems contained in one or more of the CRAC units 120a–120e. The computing device 126 may also be configured to receive input from a user, for instance, data center personnel, an administrator, a manager, etc. The input received from a user may comprise various set points by which the computing device 126 may determine how and when to manipulate the operations of the variable controllable systems.

The computing device 126 may communicate with one or more of the CRAC units 120a–120e via wired communication lines (not shown). However, it should be understood that communications between one or more of the CRAC units 120a–120e and the computing device 126 may be effectuated through a wireless protocol, such as IEEE 802.11b, 802.11g, wireless serial connection, Bluetooth, etc., or combinations thereof, without departing from a scope of the invention. In addition, although a single computing device 126 is illustrated, each of the CRAC units 120a–120e may include their own respective computing device 126. Moreover, the computing device 126 may comprise controllers that are integrally formed or otherwise form part of each of the CRAC units 120a–120e. Thus, although the data center 100 has been illustrated as containing a certain configuration, it should readily be understood that various other configurations are possible for the data center 100 without departing from a scope of the invention.

The data center 100 depicted in FIG. 1A represents a generalized illustration and other components may be added or existing components may be removed or modified without departing from the scope of the invention. For example, the data center 100 may include any number of racks and various other apparatuses known to be housed in data centers. Thus, although the data center 100 is illustrated as containing seven rows of racks 102–114, it should be understood that the data center 100 may include any number of racks, for instance, 100 or more racks, without departing from the scope of the invention. In addition, each of the rows of racks 102–114 may contain any number of racks. The depiction of the racks 102a–114e is thus for illustrative and simplicity of description purposes only and is not intended to limit the invention in any respect. As another example, the data center 100 may include any number of CRAC units 120a–120e, each having a number of different types of cooling systems.

The data center 100 may also include a lowered ceiling (not shown) configured with returns for receiving heated cooling fluid from within the data center 100. The lowered ceiling may also include or form a plenum for directing the heated cooling fluid to the CRAC units 120a–120e. An example of a data center 100 having a lowered ceiling may be found in co-pending and commonly assigned U.S. patent application Ser. No. 10/262,879, filed on Apr. 17, 2002, the disclosure of which is hereby incorporated by reference in its entirety.

Figure 1B:
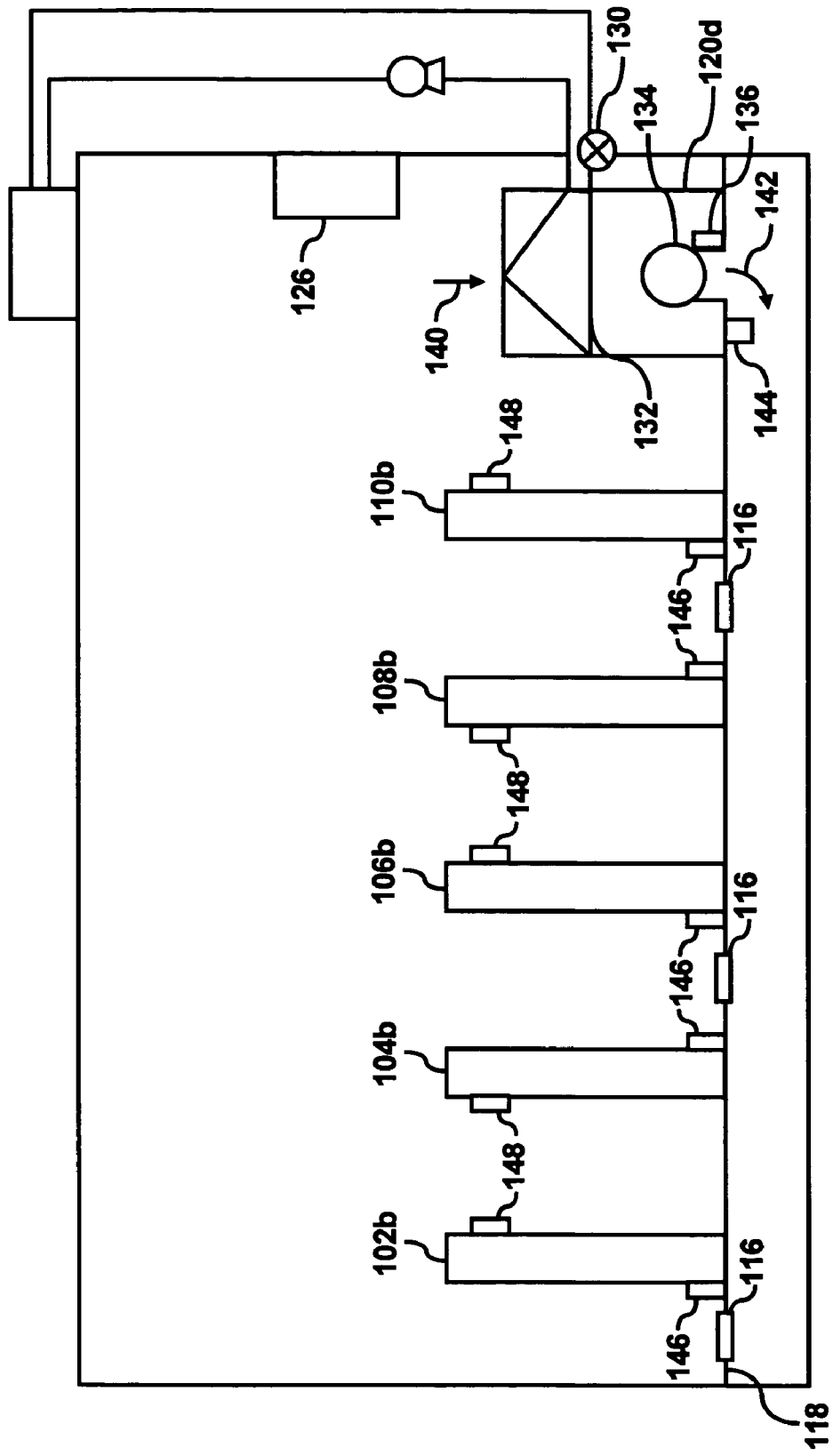
FIG. 1B shows a simplified cross-sectional side elevational view of FIG. 1A taken along line IB—IB.

With reference now to FIG. 1B, there is shown a simplified cross-sectional side elevational view of FIG. 1A taken along line IB—IB. FIG. 1B represents a generalized illustration and other components may be added or existing components may be removed or modified without departing from the scope of the invention as described hereinabove. More particularly, FIG. 1B shows the CRAC unit 120d and the racks, 102b, 104b, 106b, 108b, 110b.

In general, air or other cooling fluid is received by the CRAC units 120a–120e and is cooled through heat transfer with coolant in the CRAC units 120a–120e. In the example illustrated in FIG. 1B, the CRAC unit 120d is configured as a chiller-type air conditioning unit. In this regard, the CRAC unit 120d includes a three-way valve 130 configured to control the flow of coolant through a cooling coil 132. The three-way valve 130 as well as other components of the CRAC unit 120d may be operated in manners consistent with conventional chiller-type air conditioning units. Alternatively, the CRAC unit 120d may be configured as a conventional chiller-type air conditioning unit having a two-way valve. As a further alternative, the CRAC unit 120d may be configured as a vapor-compression type air conditioning unit in which a conventional vapor-compression cycle may be employed to cool air received into the CRAC unit 120d. In addition, the other CRAC units 120a–120c and 120e may also be configured as chiller-type or vapor compression type of air conditioning units.

The CRAC unit 120d also includes a blower 134 that may be controlled to vary the volume flow rate of air delivered into a space 138 located beneath the raised floor 118. The speed or the output of the blower 134 may be controlled through use of any reasonably suitable and commercially available variable frequency drive (VFD) 136, which is shown as being positioned adjacent to the blower 134. The VFD 136 generally operates to control the blower 134 to vary the volume flow rate of airflow into and out of the CRAC unit 120d.

The arrow 140 generally indicates the heated airflow path into the CRAC unit 120d. In general, through heat exchange with the coolant contained in the cooling coil 132, heat is removed from the air received into the CRAC unit 120d. In addition, the cooled air is supplied into the data center 100 through operation of the blower 134, as indicated by the arrow 142. The computing device 126 may be configured to control the temperature of the coolant contained in the cooling coil 132 and speed of the blower 134 to thereby control the cooling of the air and the volume flow rate of the supplied air.

In certain instances, each of the CRAC units 120a–120e may be operated in substantially independent manners. For example, one or both of the temperature and the volume flow rate of air delivered by each of the CRAC units 120a–120e may differ for one or all of the CRAC units 120a–120e. In one regard, one or both of the temperature and the volume flow rate of air delivered to various sections of the data center 100 may differ from one or both of the temperature and the volume flow rate of air supplied by any individual CRAC unit 120a–120e.

The temperatures of the cooled air supplied by the CRAC units 120a–120e may be detected by temperature sensors, for instance, the temperature sensor 144 depicted in FIG. 1B. As shown, the temperature sensor 144, hereinafter, supply temperature sensor 144, is positioned to detect the temperature of the airflow supplied by the CRAC unit 120d.

Although the supply temperature sensor 144 is illustrated as being attached to a bottom surface of the raised floor 118 proximate the outlet of the CRAC unit 120d, the supply temperature sensor 144 may be positioned at any reasonably suitable location where the supply temperature sensor 144 may detect the temperature of the air supplied by the CRAC unit 120d. This is also true for the other CRAC units 120a–120d and 120e.

Additional temperature sensors 146 and 148, hereinafter inlet temperature sensors 146 and outlet temperature sensors 148, are also illustrated in FIG. 1B. As the name implies, the inlet temperature sensors 146 are configured to detect the temperatures of cooled air supplied through the vent tiles 116. In addition, the outlet temperature sensors 148 are configured to detect the temperatures of the heated air exhausted from the racks 102a–114e. Although not explicitly shown, some or all of the racks 102a–114e may contain the inlet temperature sensors 146 and the outlet temperature sensors 148. Through use of the inlet temperature sensors 146 and the outlet temperature sensors 148, the changes in temperatures of the airflow through individual racks 102a–114e equipped with the sensors 146, 148 may be determined. The placements of the inlet temperature sensors 146 and the outlet temperature sensors 148 with respect to their associated racks 102a–102e are for illustrative purposes only and are not meant to limit the data center 100 in any respect. Instead, the inlet temperature sensors 146 and the outlet temperature sensors 148 may be positioned at any reasonably suitable locations without departing from a scope of the data center 100.

Although reference is made in FIG. 1B to the use of the blower 134 to draw heated air from the data center 100, it should be understood that any other reasonably suitable manner of heated air removal from the data center 100 may be implemented without departing from the scope of the invention. By way of example, a separate fan or blower (not shown) may be employed to draw the heated air from the data center 100. In addition, the CRAC units 120a–120d may include at least one of a humidifier and a dehumidifier as is known to those of ordinary skill in the art.

Figure 2:
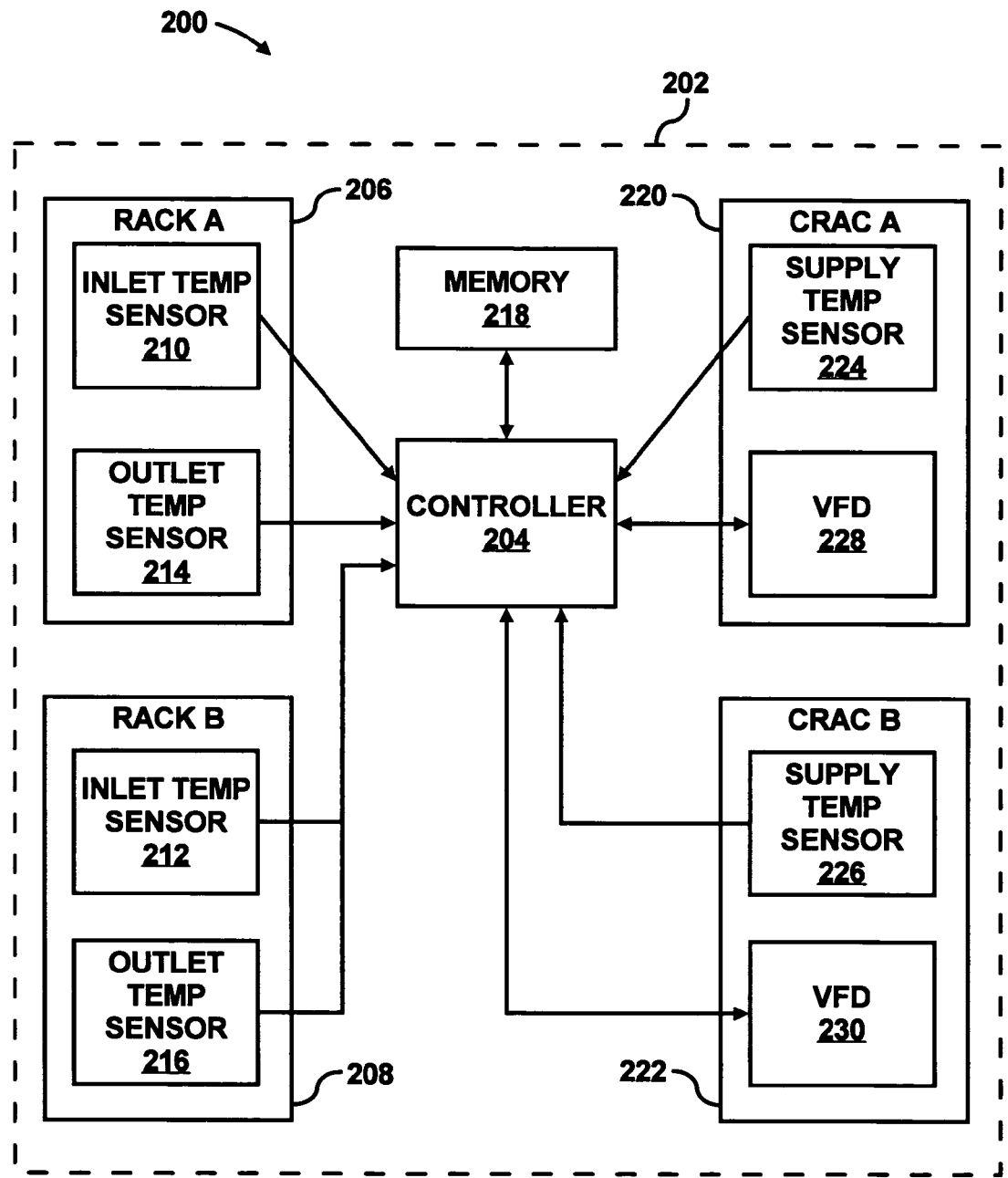
FIG. 2 illustrates a block diagram of a control system, which may be employed to perform various operations according to various embodiments.

FIG. 2 illustrates a block diagram 200 of a control system 202 which may be employed to perform various operations according to various embodiments. The following description of the block diagram 200 is one manner of a variety of different manners in which such a control system 202, may be configured. In addition, it should be understood that the block diagram 200 may include additional components and that some of the components described herein may be removed or modified without departing from the scope of the invention.

The control system 202 includes a controller 204 for controlling various operations of the control system 202. The controller 204 may, for instance, comprise the computing device 126 and thus may also comprise a microprocessor, a micro-controller, an application specific integrated circuit (ASIC), and the like. The controller 204 may, alternatively, comprise a separate computing device.

As shown, the controller 204 is configured to receive temperature data from two racks, rack A 206 and rack B 208, which may be configured as any of the racks 102a–114e depicted in FIGS. 1A and 1B. Each of the racks 206 and 208 is configured with respective inlet temperature sensors 210 and 212 and respective outlet temperature sensors 214 and 216. The temperature measurements obtained by the sensors 210–216 are sent to the controller 204. Information from the sensors 210–216 may be sent to the controller 204 through, for instance, an Ethernet-type connection or through a wired protocol, such as IEEE 802.3, etc., or wireless protocols, such as IEEE 802.11b, 802.11g, wireless serial connection, Bluetooth, etc., or combinations thereof. Although two racks 206 and 208 are depicted in FIG. 2, the controller 204 may be configured to receive temperature data from temperature sensors 146, 148 positioned around any number of racks, including all of the racks 102a–114e shown in FIGS. 1A and 1B.

The controller 204 may store these measurements in a memory 218. The memory 218 may also store programs or other software, which the controller 204 may access in performing various operations as described in greater detail hereinbelow. In any regard, the memory 218 may comprise a traditional memory device, such as, volatile or non-volatile memory, such as DRAM, EEPROM, flash memory, combinations thereof, and the like.

As also shown in FIG. 2, the controller 204 is configured to receive various data from two CRAC units, CRAC unit A 220 and CRAC unit B 222, which may be configured as any of the CRAC units 120a–120e shown in FIG. 1A. Although two CRAC units 220 and 222 are depicted in FIG. 2, the controller 204 may be configured to receive data from any number of CRAC units, including all of the CRAC units 120a–120e shown in FIG. 1A. In any regard, the CRAC units 220 and 222 are configured with respective supply temperature sensors 224 and 226. The temperature measurements obtained by the supply temperature sensors 224 and 226 are sent to the controller 204. The CRAC units 220 and 222 are also configured with respective VFDs 228 and 230.

The controller 204 may be configured to operate the VFDs 228 and 230 to vary the volume flow rate of air supplied by each of the CRAC units 228 and 230. In addition, the volume flow rates may be calculated by the controller 204 through a determination of the VFD 228 and 230 speeds. Alternatively, the volume flow rates may be detected through use of separate sensors, for instance, anemometers positioned to detect the velocities of the supply air. Information from the supply temperature sensors 224 and 226 and the VFDs 228 and 230 may be sent to the controller 204 through, for instance, an Ethernet-type connection or through a wired protocol, such as IEEE 802.3, etc., or wireless protocols, such as IEEE 802.11b, 802.11g, wireless serial connection, Bluetooth, etc., or combinations thereof. In addition, the controller 204 may be configured to store the information received from the supply temperature sensors 224 and 226 and the VFDs 228 and 230 in the memory 218.

The memory 218 may also store an algorithm, for instance, in the form of software, configured to calculate an air re-circulation index based upon some of the information received from the inlet temperature sensors 210 and 212, the outlet temperature sensors 214 and 216 and the supply temperature sensors 224 and 226. The index of air re-circulation may be defined as a supply heat index (SHI). The SHI may be defined as a measure of the infiltration of heated air into the cooled air. The SHI of a particular rack (i) may be determined according to the following equation:

$$(SHI)_i = \frac{\delta Q}{Q + \delta Q} \qquad \text{Equation (1)}$$

Where Q represents the heat dissipation from all the components in the rack (i) and $\delta Q$ represents the rise in enthalpy of the cooled air before entering the rack (i).

The heat dissipation Q and the rise in enthalpy of the air δQ of the rack (i) may be determined through the following equations:

$$Q_i = mC_p(T_{out} - T_{in}) \quad \text{Equation (2)}$$

$$\delta Q_i = mC_p(T_{in} - T_{ref}) \quad \text{Equation (3)}$$

Where m is the mass flow rate through the rack (i), $C_p$ is the specific heat capacity of the air supplied to the rack (i), and ($T_{in}$) and ($T_{out}$) are the inlet and outlet temperatures of the rack (i). In addition, $T_{ref}$ denotes the vent tile 116 air supply temperature, which may be equivalent to the supply air temperature of the CRAC unit 120a–120e in closest proximity to the rack (i). Incidentally, and as discussed hereinabove, the supply air temperatures may differ due to differences in the supply air temperatures of the CRAC units 120a–120e.

The numerator in equation 1 denotes the sensible heat gained by the air supplied by the CRAC units 120a–120e before entering the rack (i), while the denominator represents the sensible heat gained by the air leaving the rack (i). Because the mass flow rates are equal for equations 2 and 3, SHI may be written as a function of rack inlet, rack outlet and CRAC unit 120a–120e supply temperatures. Thus, SHI may be represented as follows:

$$SHI_i = \left( \frac{T_{in} - T_{ref}}{T_{out} - T_{ref}} \right) \quad \text{Equation 4}$$

A more detailed description of SHI may be found in co-pending and commonly assigned U.S. patent application Ser. No. 10/446,854, filed on May 29, 2003. The disclosure contained in that Application is incorporated herein by reference in its entirety.

Thus, for instance, the controller 204 may determine the SHIs for the racks 206 and 208 through implementation of the algorithm described hereinabove. As an example, the controller 204 may determine the SHI for rack A 206 based upon the inlet temperature measured by the inlet temperature sensor 210, the outlet temperature measured by the outlet temperature sensor 214, and the reference or supply temperatures of one or both of the CRAC units 220 and 222. The reference or supply temperature used in the SHI calculations for the racks 206 and 208 may be determined in a variety of manners. For instance, if it is known that a particular rack 206 or 208 receives cooled air from a single CRAC unit 220 or 222, the temperature of the cooled air supplied by that CRAC unit 220 or 222 may be used as the reference temperature in determining SHI. Thus, the reference or supply temperature used in the SHI calculations may be based upon historical data. Alternatively, a sensor may be positioned to detect the temperature of the cooled air supplied through a vent tile 116 arranged supply a particular rack 206 or 208 with the cooled air. In this example, the temperature detected by that sensor may be used as the reference or supply temperature.

As another example, a metric may be developed that describes the effect of any CRAC unit 220, 222 on a rack 206, 208. In this example, the metric may be developed through perturbation of CRAC 220, 222 air supply temperature by predefined amounts along with detection of temperatures at the inlets of the racks 206, 208. Based upon the supply air temperature and the detected inlet temperature, a sensitivity correlation may be developed with cooled air temperature and flow rate as variables. In addition, metrics from various CRAC units 220, 222 may be combined to determined combined effects on inlet temperatures to various racks 206, 208. The sensitivity correlation may be used to determine the effects of various CRAC units 220, 222 on particular racks 206, 208 and the reference or supply temperature used in the SHI calculation may be determined through implementation of the sensitivity correlation.

The memory 218 may also store additional algorithms or software configured to perform various operations as will be described in greater detail with reference to the following operational modes.

Figure 3:
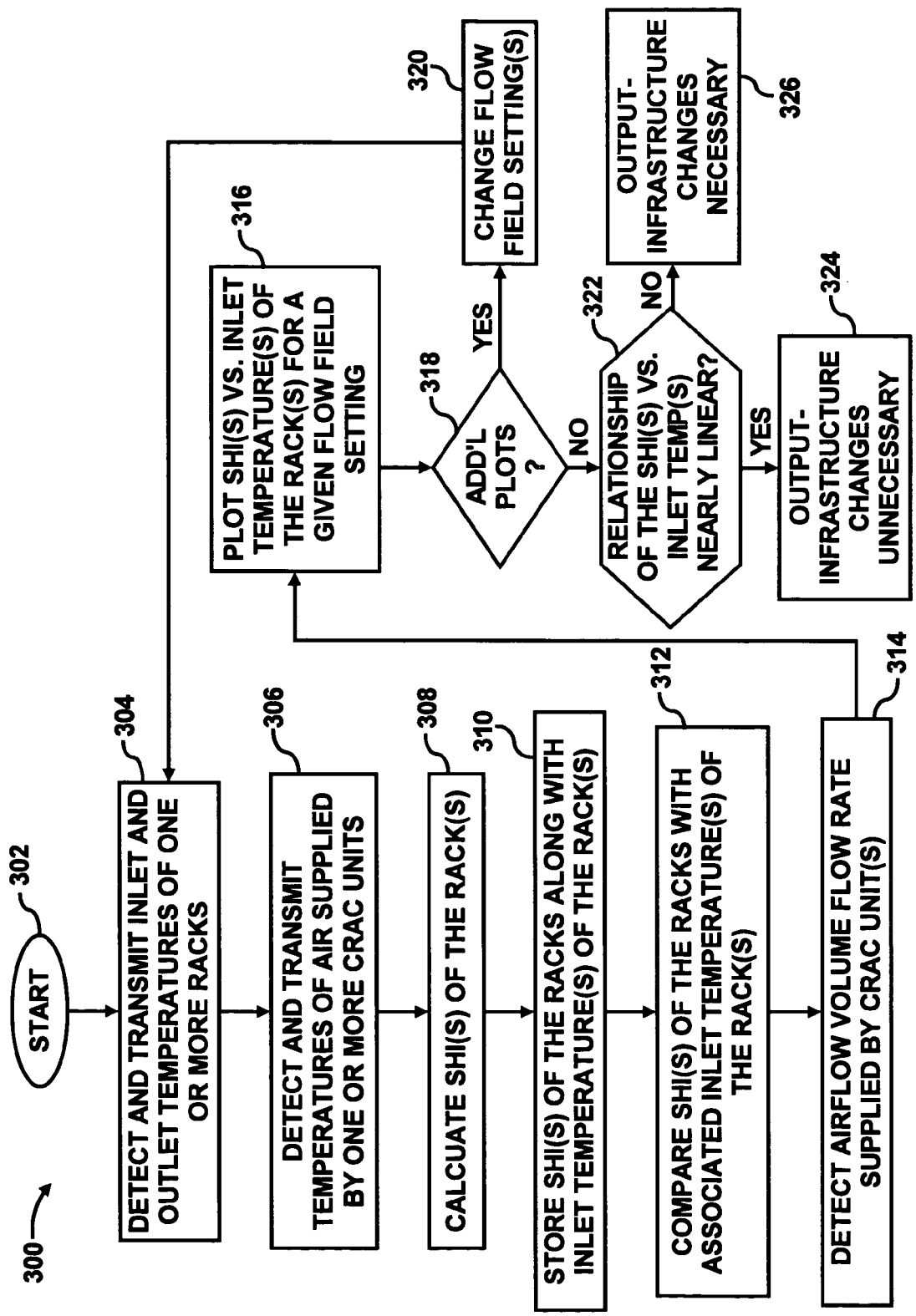
FIG. 3 illustrates a flow diagram of an operational mode for determining whether substantially optimized airflow conditions exist in the data center based upon SHI determinations.

FIG. 3 illustrates a flow diagram of an operational mode 300 for determining whether substantially optimizied airflow conditions exist in the data center 100 based upon SHI determinations. It is to be understood that the following description of the operational mode 300 is one manner of a variety of different manners in which the airflow in the data center 100 may substantially be optimized. It should also be apparent to those of ordinary skill in the art that the operational mode 300 represents a generalized illustration and that other steps may be added or existing steps may be removed, modified or rearranged without departing from a scope of the invention.

The description of the operational mode 300 is made with reference to the block diagram 200 illustrated in FIG. 2, and thus makes reference to the elements cited therein. It should, however, be understood that the operational mode 300 is not limited to the elements set forth in the block diagram 200. Instead, it should be understood that the operational mode 300 may be practiced by control systems having different configurations than the configuration set forth in the block diagram 200.

The operational mode 300 may be initiated or started at step 302, for instance, by activating one or more CRAC units 220, 222, activating one or more components in the data center 100, etc. In addition, or alternatively, the operational mode 300 may be manually initiated, after a predetermined period of time, etc.

At step 304, the temperatures of the airflow delivered into one or more racks 206, 208 may be detected with respective inlet temperature sensors 210, 212. In addition, the temperatures of the airflow exhausted from one or more racks 206, 208 may be detected with respective outlet temperature sensors 214, 216. These temperature measurements may be sent to the controller 204 as described hereinabove. In addition, the controller 204 may store the received information along with the associated rack 206, 208 from which the information was received. In this regard, the inlet temperatures and the outlet temperatures of each rack 206, 208 may be stored along with their associated rack 206, 208. This information may be stored, for instance, in the form of a look-up table that associates the racks 206, 208 along with their inlet and outlet temperatures.

The controller 204 may also receive the temperatures of air supplied by one or more CRAC units 220, 222 detected by respective supply temperature sensors 224, 226, at step 306. The controller 204 may store this information in the memory 218 along with the identifications of the one or more CRAC units 220, 222 associated with the temperature sensors 224, 226. Again, this information may be stored, for instance, in the form of a look-up table that associates the CRAC units 220, 222 with the temperature measurements.

At step 308, the controller 204 may calculate the SHIs of the one or more racks 206, 208 in a manner as described hereinabove with respect to FIG. 2. More particularly, for a particular rack, the controller 204 may calculate the difference in inlet temperature and reference temperature (supply temperature) divided by the difference in outlet temperature and the reference temperature (supply temperature). The controller 204 may also store the calculated SHIs for the various racks 206, 208 in the memory 218 in addition to the inlet temperatures of the various racks 206, 208, as indicated at step 310.

At step 312, the controller 204 may compare the SHI(s) of the various racks 206, 208 with their associated inlet temperatures. The controller 204 may further store this comparison in the memory 218. At step 314, the controller 204 may also receive information pertaining to the volume flow rate of air supplied by one or more CRAC units 220, 222. The controller 204 may determine the volume flow rate through a correlation between the VFD 228, 230 speed and the known volume flow rate of air at the detected VFD 228, 230 speed. The correlation between the VFD 228, 230 speed and the volume flow rate may be supplied by the VFD 228, 230 manufacturer or it may determined through testing of the VFD 228, 230. Alternatively, a separate sensor (not shown), for instance, an anemometer, may be employed to detect the velocity of airflow and a volume flow rate may be calculated through any reasonably suitable known means. In any regard, the controller 204 may store the volume flow rate information of the one or more CRAC units 220, 222 in the memory 218.

The controller 204 may create a plot of the SHI(s) vs. the inlet temperature(s) of the various racks 206, 208 for a given flow field setting, at step 316. In addition, at step 318, the controller 204 may determine whether additional plots should be obtained. If additional plots are to be obtained, the controller 204 may control or otherwise cause one or more flow field settings to be changed at step 320. The flow field settings may include the volume flow rates of one or more CRAC units 220, 222, the airflow characteristics through one or more vent tiles 116, the positions of adjustable panels or adjustable louvers configured to vary airflow into individual racks, the speeds of rack-mounted fans, etc. In addition, the one or more vent tiles may be positioned on a raised floor, a lowered ceiling, a delivery point of a ducted supply network, a return point of a ducted return network, etc. The adjustable panels were described in co-pending and commonly assigned U.S. patent application Ser. No. 10/425,624, and the adjustable louvers were described in co-pending and commonly assigned U.S. patent application Ser. No. 10/425,621, both of which were filed on Apr. 30, 2003. In addition, the disclosures of these applications are incorporated herein by reference in their entireties.

Figure 4A:
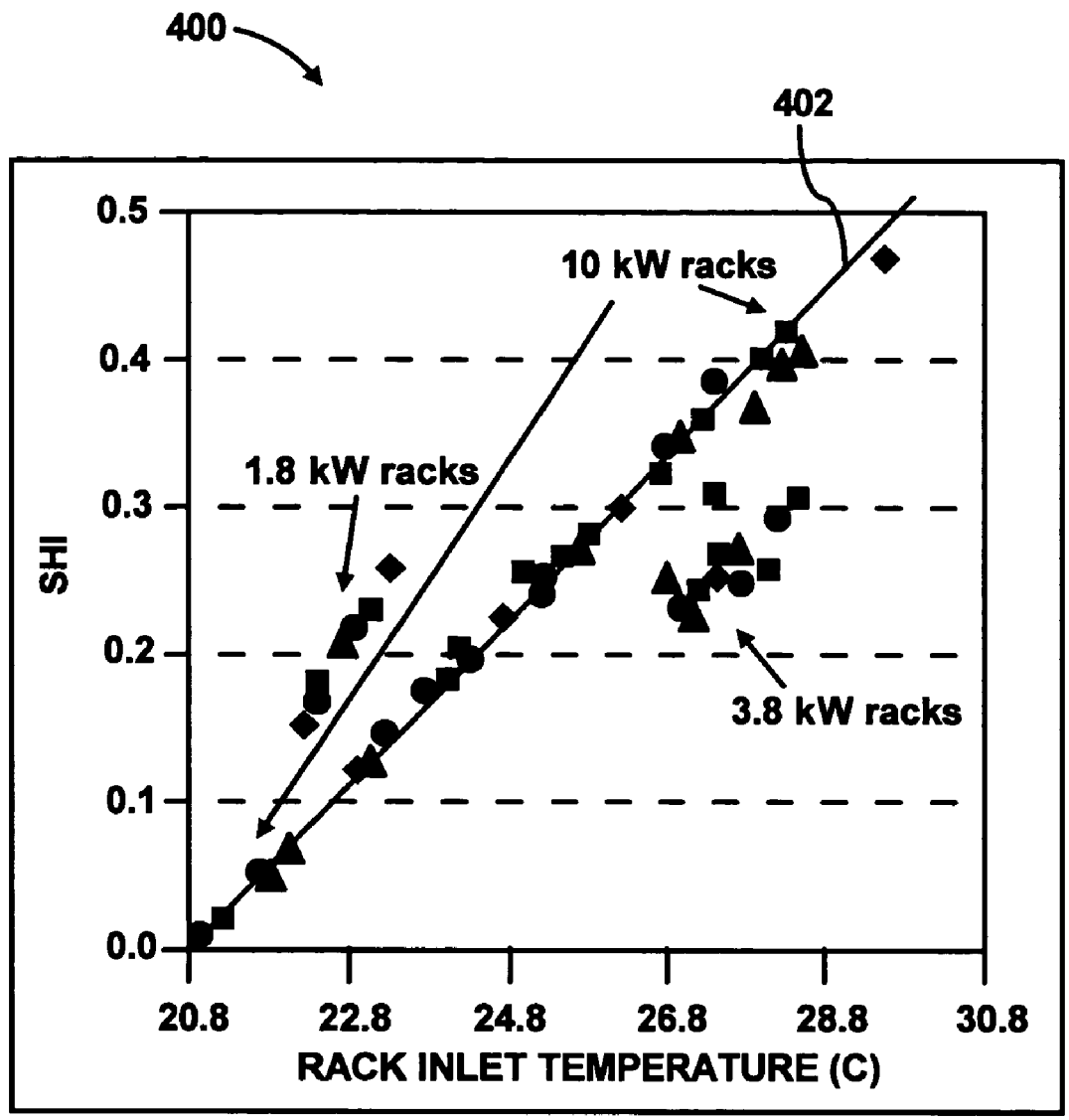
FIGS. 4A and 4B illustrate examples of respective graphs that may be generated based upon the SHI values and the inlet temperature values for various CRAC unit volume flow rate settings.
Figure 4B:
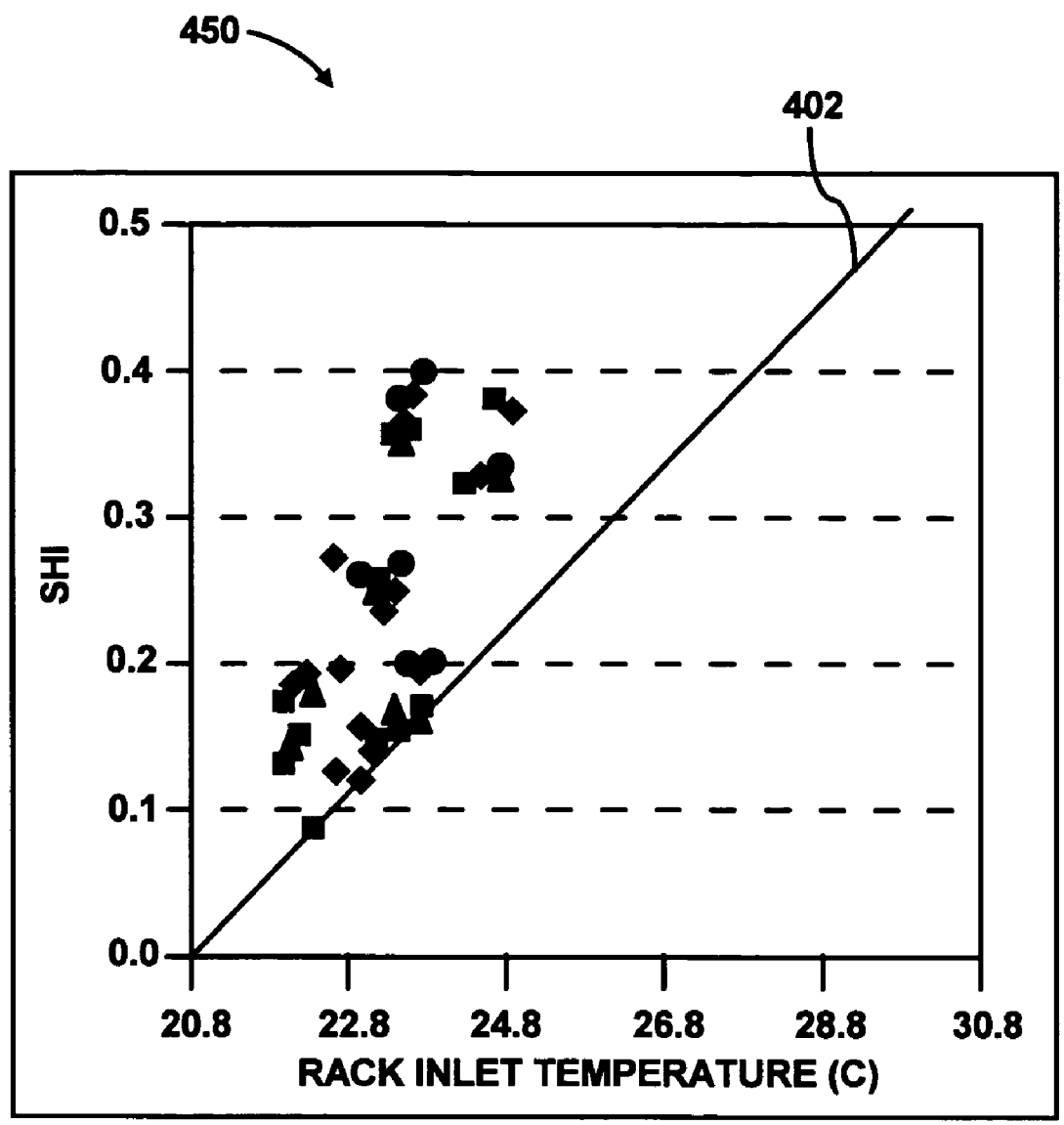

The changes to airflow characteristics through one or more vent tiles 116 may be performed either manually or through use of computer controlled vent tiles. An example of computer controlled vent tiles may be found in commonly assigned U.S. Pat. No. 6,574,104, the disclosure of which is incorporated herein by reference in its entirety. In addition, steps 304–320 may be repeated for the various flow field settings. In this regard, the SHI values and the inlet temperature values may be plotted for various CRAC unit 220, 222 supply volume flow rates. FIGS. 4A and 4B illustrate examples of respective graphs 400 and 450 that may be generated by the controller 204 based upon the SHI values and the inlet temperature values for various flow field settings.

When the re-circulation heat load caused by hot air infiltration is negligible compared to the actual heat loads, equation (1) may be reduced to a linear equation in SHI, as follows:

$$SHI_i = \left( \frac{T_{in} - T_{ref}}{(T_{out} - T_{in}) + (T_{in} - T_{ref})} \right) \approx \frac{\delta Q}{Q} = \frac{T_{in} - T_{ref}}{X_i} \quad \text{Equation (5)}$$

Where $X_i = (T_{out} - T_{in})$ denotes the temperature difference due to actual heat load of the $i^{th}$ rack. FIG. 4A shows the variation of SHI based upon equation (1) with rack inlet temperatures for racks in a row for different flow field settings. The linear dependence of the plots in FIG. 4A follows the relationship shown in equation (2), thereby indicating that the re-circulation heat load is negligible relative to the actual heat loads in the racks.

For the plots in graphs 400 and 450, the racks were held under constant heat loads for the various CRAC unit 220, 222 flow settings. In addition, a reference straight line 402 is illustrated to show, for instance, that the SHI vs. inlet temperature plots for the rack(s) having 10 kW heat loads is nearly linear in the graph 400. More particularly, at the various CRAC unit 220, 222 flow settings as indicated by the different symbols, the SHI values vs. the inlet temperatures are nearly linear for the racks.

The graphs 400 and 450 show respective relationships between SHI values and rack inlet temperatures for a plurality of racks at various flow field settings. Each of the different symbols represents a different flow field setting. In addition, each of the symbols may represent one or more racks at the different flow field settings. Thus, for instance, one circle in the graph 400 may represent a first rack or racks and another circle may represent a second rack or racks at a first flow field setting. In addition, a square may represent the first rack(s) at and another square may represent the second rack(s) at a second flow field setting.

In comparing the graphs 400 and 450, it is clearly evident that the plots in graph 400 are nearly linear whereas the plots in graph 450 are not arranged in a linear relationship. Thus, the graph 450 generally denotes that the re-circulation heat load caused by hot air infiltration is significant compared to the actual heat loads. Therefore, the graph 450 generally indicates that there may be adverse airflow patterns in the data center 100 which may lead to, for instance, inefficient CRAC unit 220, 222 operations as well as inefficient heat removal from the racks.

Referring back to FIG. 3, particularly to step 318, if no additional plots are to be obtained, for instance, a predetermined number of SHI and inlet temperature values have been obtained, the graph, for instance, as illustrated in the graphs 400 and 450, may be analyzed to determine whether the relationships between the SHI values and the inlet temperatures are nearly linear at step 322. As shown in FIG. 4A, the plots of the SHI values and the inlet temperatures for various racks at various supply volume airflow rates are nearly linear for racks having different heat loads. Thus, linearity may be determined through a visual inspection of the graph.

Alternatively, the degree of linearity among the plots may be computed according to the square of the correlation coefficient (R). The correlation coefficient (R) defines the degree of linear relationship between variables measured from an original data and can range from 0, which is completely non-linear to 1, which is completely linear. Based upon the plots in the graph, either graph 400 or 450, a correlation coefficient may be calculated. In addition, an error factor may be considered in determining whether the plots are nearly linear. Thus, for instance, even if the square of the correlation coefficient (R) does not equal 1, if it is nearly equal to one, for instance, if $R^2>0.9$, the plots may be considered as being nearly linear. The determination of the acceptable level of deviation from $R^2=1$ while still considering the plots to be nearly linear may be based upon a number of factors.

By way of example, a relatively arbitrary correlation coefficient, for instance, 0.9, may be selected as a lower boundary for considering the plots as being nearly linear. As another example, the lower boundary for the correlation coefficient may be determined through testing configured to indicate correlations between acceptable SHI levels and correlation coefficients. As a further example, the lower boundary for the correlation coefficient may be based upon known uncertainties in the determination of the SHI values inputted into the graph. In this example, for instance, the degree of uncertainty in measuring one or more of the inlet temperatures, the outlet temperatures, and the supply air temperatures may be used to determine the lower boundary for the correlation coefficient.

Regardless of the manner in which the lower boundary for the correlation coefficient is defined, the correlation coefficients for plots obtained for various locations in the data center 100 need not be the same for the various locations.

If, at step 322, it is determined that the relationship between the SHI(s) vs. the inlet temperatures of the racks is nearly linear, for instance, as shown in FIG. 4A, the controller 204 may be configured to output an indication that the data center 100 infrastructure need not be changed as step 324. The data center 100 infrastructure may include the positioning of the CRAC units 220, 222, the vent tiles 116, the racks 206, 208, etc. In any regard, as described hereinabove with respect to FIG. 4A, nearly linear SHI vs. inlet temperature values is an indication that the re-circulation heat load caused by hot air infiltration is negligible compared to the actual heat loads. In other words, the data center 100 layout may be considered as being nearly optimized in terms of airflow optimization.

Alternatively, if at step 322, it is determined that the relationship between the SHI(s) vs. the inlet temperatures of the racks is not nearly linear, for instance, as shown in FIG. 4B, the controller 204 may output an indication that the data center 100 infrastructure requires changes at step 326. As described hereinabove with respect to FIG. 4B, this situation is indicative of re-circulation heat load due to hot air infiltration being significant compared with the actual heat loads in the racks. In one regard, the infrastructure changes may be made to substantially reduce SHI values as well as to obtain plots having nearly linear SHI vs. inlet temperature values to thus substantially optimize airflow in the data center 100.

Through implementation of the operational mode 300, airflow characteristics in the data center 100 may be determined and substantially optimized to reduce or minimize, for instance, hot air re-circulation into the racks.

A computational fluid dynamics (CFD) tool programmed to model airflow patterns for various data center configurations may be employed to perform the operational mode 300. More particularly, the CFD tool may be programmed to calculate the SHI values for various areas in the variously configured data centers based upon different CRAC flow settings and to plot the calculated SHI values as shown in FIGS. 4A and 4B. By way of example, some or all of the inputs, for instance, heat loads in the racks, volume flow rates of air supplied by one or more CRAC units, the layout of the data center, etc., may be manually inputted into the CFD tool. In this regard, the CFD tool may be configured to determine various variables, such as, rack inlet and outlet temperatures, volume flow rates, SHI values, etc., based upon calculated airflow characteristics in the data center 100 and the inputted information.

In addition, the CFD tool may be programmed to determine whether the plots denote a nearly linear relationship. In one regard, if the plots do not denote a nearly linear relationship, the CFD tool may be programmed to substantially continuously re-configure the data center infrastructure until a nearly linear relationship is established. Consequently, a CFD tool employing the operational mode 300 may be used as a tool for designing the layout of the data center, such that, for instance, airflow in the data center may be substantially optimized.

Figure 5:
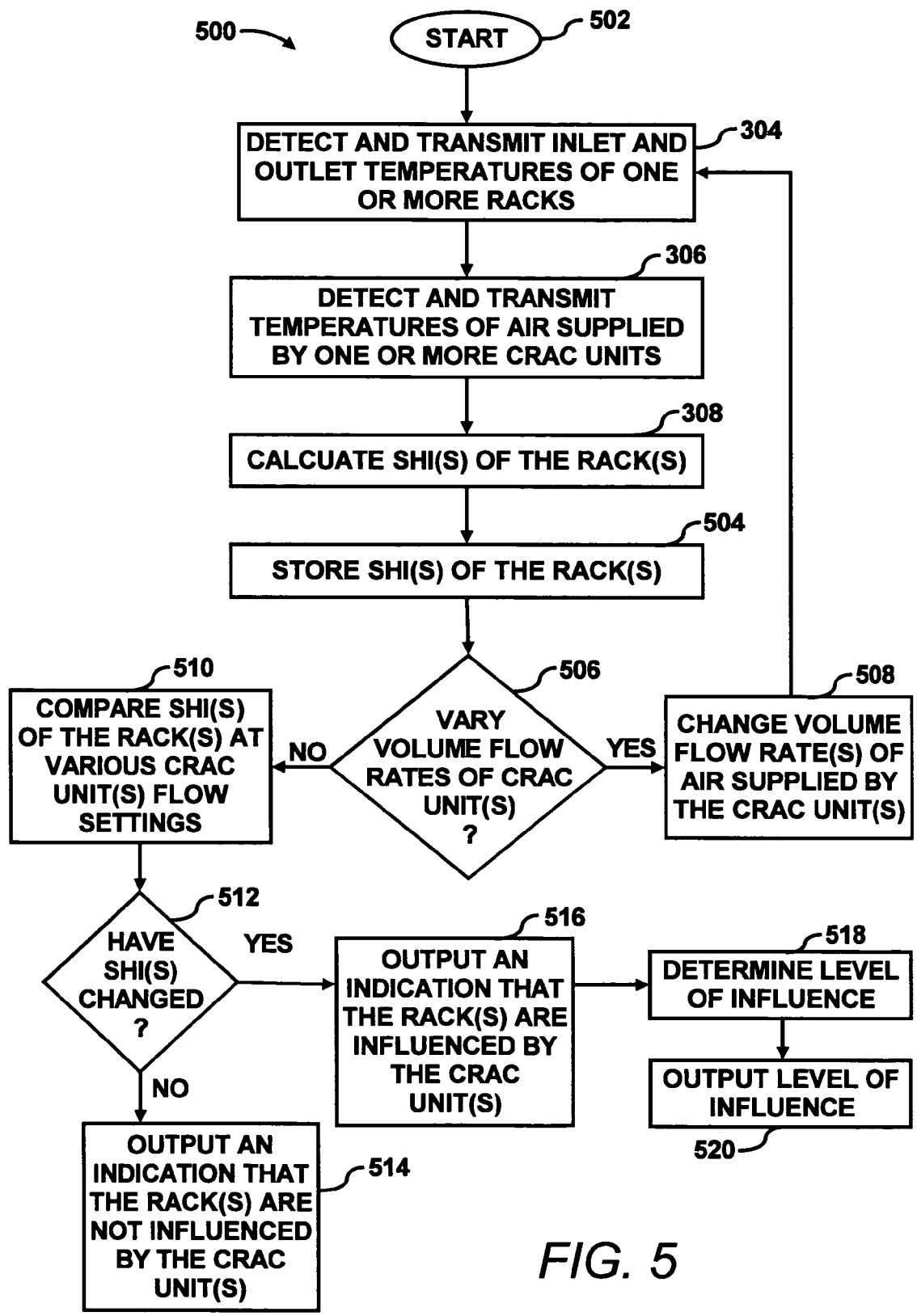
FIG. 5 shows a flow diagram of an operational mode for at least one of evaluating the influence of CRAC units and controlling the CRAC units based upon SHI determinations at various locations of a data center.

With reference now to FIG. 5, there is shown a flow diagram of an operational mode 500 for at least one of evaluating the influence of CRAC units 220, 222 and controlling the CRAC units 220, 222 based upon SHI determinations at various locations of a data center 100. It is to be understood that the following description of the operational mode 500 is one manner of a variety of different manners in which the airflow in the data center 100 may substantially be optimized. It should also be apparent to those of ordinary skill in the art that the operational mode 500 represents a generalized illustration and that other steps may be added or existing steps may be removed, modified or rearranged without departing from a scope of the invention.

The description of the operational mode 500 is made with reference to the block diagram 200 illustrated in FIG. 2, and thus makes reference to the elements cited therein. It should, however, be understood that the operational mode 500 is not limited to the elements set forth in the block diagram 200. Instead, it should be understood that the operational mode 500 may be practiced by control systems having different configurations than the configuration set forth in the block diagram 200.

The operational mode 500 may be initiated or started at step 502, for instance, by activating one or more CRAC units 220, 222, activating one or more components in the data center 100, etc. In addition, or alternatively, the operational mode 500 may be manually initiated, after a predetermined period of time, etc.

Steps 304–308 are the same as those steps described hereinabove with respect to FIG. 3. Therefore, a detailed description of these steps is not reproduced. Instead, the description of steps 304–308 set forth hereinabove is relied upon as providing sufficient disclosure of these steps.

At step 504, the SHI value(s) of one or more racks 206, 208 calculated at step 308 are stored in the memory 218. At step 506, it is determined whether the volume flow rates of one or more CRAC units 220, 222 is to be varied. The volume flow rate of air supplied by at least one CRAC unit 220, 222 is varied during a first iteration of the operational mode 500. However, the volume flow rates of one or more CRAC units 220, 222 may not necessarily be changed during further iterations of the operational mode 500. For instance, a "no" condition at step 506 may be reached after a predetermined number of iterations, or more particularly, when a predetermined number of SHI calculations have been obtained. The predetermined number of iterations may be based upon, for instance, the level of accuracy desired in determining whether certain racks 206, 208 are influenced by certain CRAC units 220, 222. Thus, for instance, a greater number of iterations may be performed to obtain greater accuracy.

It may be beneficial to vary the volume flow rates of air supplied by one or more CRAC units 220, 222 without varying the temperatures of the air. In one regard, CRAC units 220, 222 are typically configured to dehumidify or humidify the air based in conjunction with varying airflow temperatures. Therefore, by limiting the changes to volume flow rates of air supplied by the one or more CRAC units 220, 222, dehumidifying and humidifying operations may substantially be avoided.

If it is the first iteration of the operational mode 500 or if it is determined that the volume flow rate of at least one CRAC unit 220, 222 is to be varied, the volume flow rates of one or more CRAC units 220, 222 may be varied at step 508. The determination of the volume flow rate of which CRAC unit 220, 222 to vary may be based upon whether it is desired to know which of the CRAC units 220, 222 has influence over a particular area or particular racks 206, 208. Thus, for instance, if it is desired to determine whether the CRAC unit 220 has influence over the rack 206, the volume flow rate of air supplied by that CRAC unit 220 may be varied and the SHI of that rack 206 may be determined and stored as indicated at steps 304–308 and 504. Steps 506 and 508 may be performed any number of times as indicated hereinabove. In addition, the flow rates of at least one of the CRAC units 220, 222 may be changed to perturb existing airflow patterns in relatively small amounts. In other words, the perturbation caused by the changes in the flow rates of at least one of the CRAC units 220, 222 may be performed, not to create a different flow pattern but to alter the extent and magnitude of existing flow patterns.

If, at step 506, it is determined that the volume flow rates of air supplied by one or more CRAC units 220, 222 is not to be varied, the controller 204 may compare the stored SHI values of the areas or one or more racks 206, 208 at the various CRAC unit 220, 222 flow settings, as indicated at step 510. The determination to not vary the volume flow rates of the one or more CRAC units 220, 222 may be reached when, for instance, sufficient SHI values have been calculated to achieve a predetermined level of accuracy in determining the influence of the CRAC units 220, 222 on the various areas or racks 206, 208.

At step 512, the controller 204 may determine whether the SHI levels for one or more areas have changed for at least two different CRAC unit 220, 222 flow settings. If no change is detected at step 512, the controller 204 may output an indication that the one or more areas are not influenced by the one or more CRAC units 220, 222 whose flow settings were changed, at step 514. Thus, for instance, if the SHI levels in a particular area have not changed in response to a change in the volume flow rate of at least one CRAC unit 220, 222, it may be assumed that one or more of the CRAC units 220, 222 do not influence the one or more areas. In addition, it may be assumed that changes in the outputs of these one or more CRAC units 220, 222 will not affect the cooling of these one or more areas. Therefore, as these one or more areas undergo varying heat load conditions, these one or more CRAC units 220, 222 do not necessarily have to be manipulated to compensate for these changing heat load conditions.

If, at step 512, the controller 204 determines that the SHI levels for the one or more areas have changed, the controller 204 may output an indication that the one or more areas are influenced by the one or more CRAC units 220, 222 whose flow settings were changed, at step 516. Thus, for instance, if the SHI levels in a particular area have changed in response to a change in the volume flow rate of at least one CRAC unit 220, 222, it may be assumed that one or more of the CRAC units 220, 222 have influence over the one or more areas. In addition, it may be assumed that changes in the outputs of these one or more CRAC units 220, 222 will affect the cooling of these one or more areas. Therefore, as these one or more areas undergo varying heat load conditions, these one or more CRAC units 220, 222 may be manipulated to compensate for these changing heat load conditions.

In addition to step 516, the controller 204 may determine the level of influence over the one or more areas by the one or more CRAC units 220, 222 at step 518. Moreover, the controller 204 may output an indication of the level of influence over one or more areas by one or more CRAC units 220, 222 at step 520. Thus, for instance, the controller 204 may determine the levels of SHI level changes and correlate that to the level of influence of the one or more CRAC units 220, 222. By way of example, the controller 204 may determine that one or more of the CRAC units 220, 222 have greater levels of influence if the changes in SHI levels are greater in response to changes in the volume flow rates of air supplied by those one or more CRAC units 220, 222. In contrast, if the changes in SHI levels are smaller in response to changes in the volume flow rates of air supplied by those one or more CRAC units 220, 222, the level of influence by those one or more CRAC units 220, 222 may be considered as being smaller. Through knowledge of the varying levels of influence over one or more areas by the one or more CRAC units 220, 222, individual operations of the CRAC units 220, 222 may substantially be tailored to, for instance, maximize efficiency and energy utilization in response to changing conditions in the data center 100.

In another regard, the operational mode 500 may be implemented to detect problems in the cooling infrastructure of the data center 100. By way of example, if it is known that one or more CRAC units 220, 222 should influence a particular area of the data center 100, but that variations in the volume flow rates of air supplied by the one or more CRAC units 220, 222 do not result in variations in SHI levels in that particular area, it may be assumed that a problem exists with either the CRAC units 220, 222 or the configuration of the vent tiles 116. Based upon this information, the CRAC units 220, 222 or the vent tiles 116 may be more closely examined to determine whether they are malfunctioning.

As with the operational mode 300 in FIG. 3, a computational fluid dynamics (CFD) tool programmed to model airflow patterns for various data center configurations may be employed to perform the operational mode 500. By way of example, some or all of the inputs, for instance, heat loads in the racks, volume flow rates of air supplied by one or more CRAC units, the layout of the data center, etc., may be manually inputted into the CFD tool. More particularly, the CFD tool may be programmed to calculate the SHI values for various areas in the variously configured data centers based upon different CRAC flow settings and to calculate SHI values based upon the different CRAC flow settings.

The CFD tool may also be programmed to determine if the SHI levels for particular areas vary in response to the different CRAC flow settings and to therefore determine whether one or more of the CRAC units influence the particular areas of the data center. In addition, the CFD tool may be further programmed to determine the level of influence one or more CRAC units have over the particular areas based upon the levels of SHI level changes described hereinabove. Consequently, a CFD tool employing the operational mode 500 may be used as a tool for evaluating the influence of one or more CRAC units over various areas in a data center. The influences of the one or more CRAC units may be used, for instance, to substantially optimize provisioning of cooling to the various areas of the data center. In one respect, the influences of the one or more CRAC units may be used as a means for selecting appropriately configured CRAC units capable of supplying sufficient cooling resources to the areas they are positioned to influence.

Figure 6:
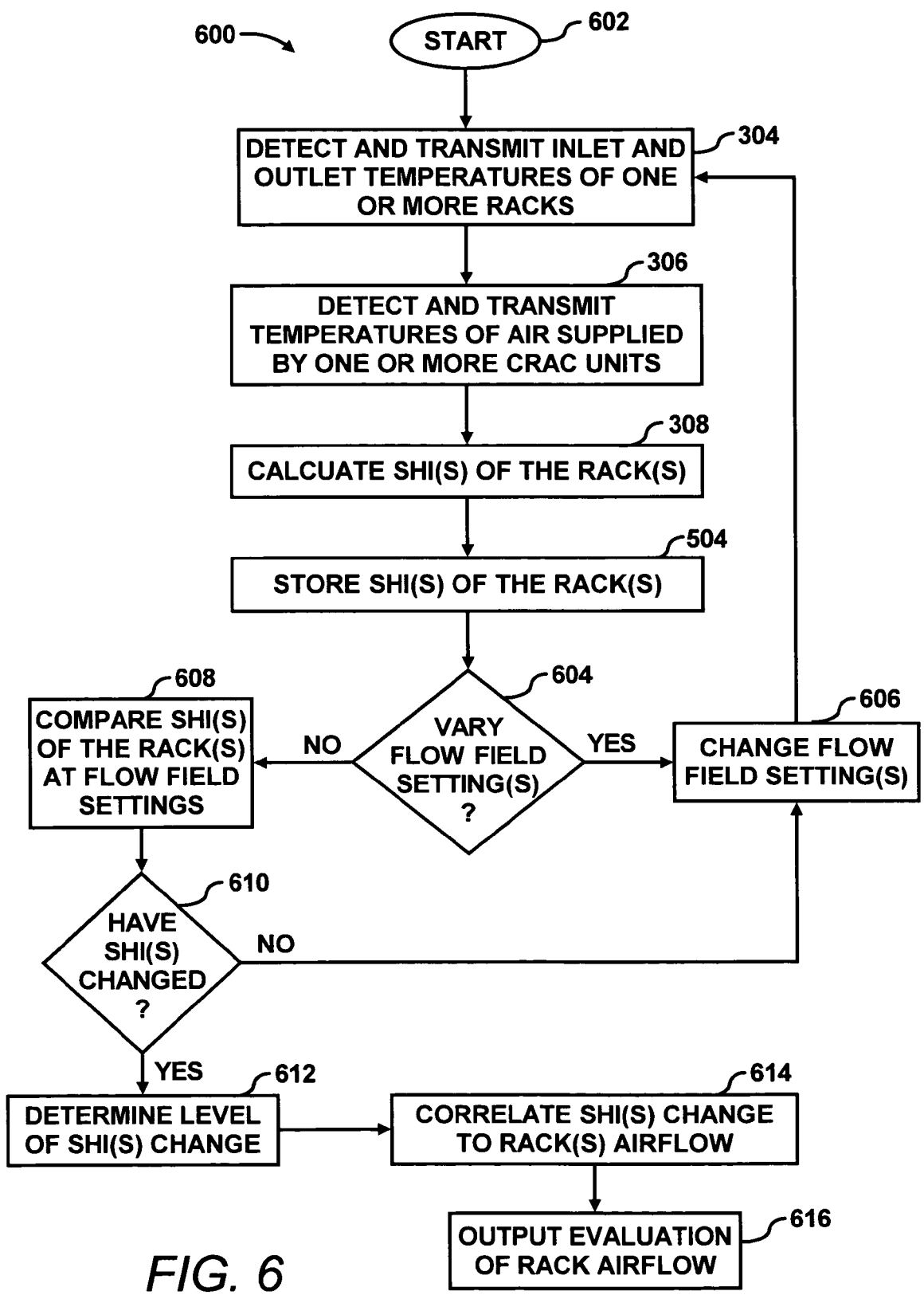
FIG. 6 shows a flow diagram of an operational mode for evaluating airflow through a rack based upon SHI determinations at various locations of a data center.

Turning now to FIG. 6, there is shown a flow diagram of an operational mode 600 for evaluating airflow through a rack based upon SHI determinations at various locations of a data center 100. It is to be understood that the following description of the operational mode 600 is one manner of a variety of different manners in which the airflow in the data center 100 may substantially be optimized. It should also be apparent to those of ordinary skill in the art that the operational mode 600 represents a generalized illustration and that other steps may be added or existing steps may be removed, modified or rearranged without departing from a scope of the invention.

The description of the operational mode 600 is made with reference to the block diagram 200 illustrated in FIG. 2, and thus makes reference to the elements cited therein. It should, however, be understood that the operational mode 500 is not limited to the elements set forth in the block diagram 200. Instead, it should be understood that the operational mode 500 may be practiced by control systems having different configurations than the configuration set forth in the block diagram 200.

The operational mode 600 may be initiated or started at step 602, for instance, by activating one or more CRAC units 220, 222, activating one or more components in the data center 100, etc. In addition, or alternatively, the operational mode 600 may be manually initiated, after a predetermined period of time, etc.

Steps 304–308 are the same as those steps described hereinabove with respect to FIG. 3. In addition, step 504 is the same as step 504 described hereinabove with respect to FIG. 5. Therefore, a detailed description of these steps is not reproduced. Instead, the description of steps 304–308 and step 504 set forth hereinabove is relied upon as providing sufficient disclosure of these steps.

At step 604, it is determined whether flow field settings affecting one or more areas of the data center 100 is to be varied. The flow field settings may include one or more of the volume flow rates of one or more CRAC units 220, 222, the layouts of one or more vent tiles 116, the positions of adjustable panels or adjustable louvers configured to vary airflow into individual racks, the speeds of rack-mounted fans, etc. In addition, the one or more vent tiles may be positioned on a raised floor, a lowered ceiling, a delivery point of a ducted supply network, a return point of a ducted return network, etc. The flow field setting may be varied during a first iteration of the operational mode 600. However, one or more of the flow field settings may not necessarily be changed during further iterations of the operational mode 600. For instance, a "no" condition at step 604 may be reached after a predetermined number of iterations, or more particularly, when a predetermined number of SHI calculations have been obtained. The predetermined number of iterations may be based upon, for instance, the level of accuracy desired in determining airflow characteristics through one or more racks 206, 208. Thus, for instance, a greater number of iterations may be performed to obtain greater accuracy.

If it is the first iteration of the operational mode 600 or if it is determined that one or more of the flow field settings are to be varied, one or more of the flow field settings may be changed at step 606. The determination of which of the flow field settings to manipulate may be based upon, for instance, historically known effects of the changes, an iterative process in which various changes in one or more of the flow field settings are performed to determine various outcomes, etc. In addition, the one or more of the flow field settings may be changed to perturb existing airflow patterns in relatively small amounts. In other words, the perturbation caused by the changes in one or more of the flow field settings may be performed, not to create a different flow pattern but to alter the extent and magnitude of existing flow patterns.

If, at step 604, it is determined that one or more of the flow field settings are not to be varied, the controller 204 may compare the stored SHI values of the areas or one or more racks 206, 208 at the various flow field settings, as indicated at step 608. The determination to not vary one or more of the flow field settings may be reached when, for instance, sufficient SHI values have been calculated to achieve a predetermined level of accuracy in determining the airflow characteristics through one or more of the racks 206, 208.

At step 610, the respective SHI levels for one or more racks at various flow field settings are compared to determine whether the SHI levels have changed at the different flow field settings. If the SHI levels have not changed for a particular rack, one or more of the flow field settings may be varied as indicated at step 606 and the SHI may be re-calculated. For a particular rack, if the SHI levels have changed for different flow field settings, the controller 204 may determine the level to which the SHI has changed at step 612. In addition, the controller 204 may correlate the change in SHI levels to the rack airflow at step 614. By way of example, the controller 204 may access a database that is stored, for instance, in the memory 218, that correlates various SHI level changes to rack airflows. The database may be configured, for instance, in the form of a look-up table.

At step 616, based upon the correlation at step 614, the controller 204 may output an evaluation of the airflows of one or more racks. In one regard, through knowledge of the airflows through the one or more racks, the racks may be reconfigured to generally enable better airflow through the one or more racks, which may yield greater optimization in the provisioning of cooling to those one or more racks.

As with the operational mode 300 in FIG. 3 and the operational mode 500 in FIG. 4, a computational fluid dynamics (CFD) tool programmed to model airflow patterns for various data center configurations may be employed to perform the operational mode 600. By way of example, some or all of the inputs, for instance, heat loads in the racks, volume flow rates of air supplied by one or more CRAC units, the layout of the data center, etc., may be manually inputted into the CFD tool. More particularly, the CFD tool may be programmed to calculate the SHI values for one or more racks based upon different CRAC flow settings and to calculate SHI values of the one or more racks based upon the different CRAC flow settings.

The CFD tool may also be programmed to determine variations in the SHI levels for the one or more racks in response to the different CRAC flow settings. The CFD tool may also be configured to evaluate the airflows through the one or more racks based upon the variations in the SHI levels. Consequently, a CFD tool employing the operational mode 600 may be used as a tool for evaluating the airflow characteristics through one or more racks. The airflow characteristics may be used, for instance, to substantially optimize provisioning of cooling to the one or more racks. In one respect, the influences of the one or more CRAC units may be used as a means for configuring the one or more racks such that airflow through the one or more racks is substantially optimized.

The operations set forth in the operational modes 300, 500, and 600 may be contained as utilities, programs, or subprograms, in any desired computer accessible medium. In addition, the operational modes 300, 500, and 600 may be embodied by computer programs, which can exist in a variety of forms both active and inactive. For example, it can exist as software program(s) comprised of program instructions in source code, object code, executable code or other formats. Any of the above can be embodied on a computer readable medium, which include storage devices and signals, in compressed or uncompressed form.

Exemplary computer readable storage devices include conventional computer system RAM, ROM, EPROM, EEPROM, and magnetic or optical disks or tapes. Exemplary computer readable signals, whether modulated using a carrier or not, are signals that a computer system hosting or running the computer program can be configured to access, including signals downloaded through the Internet or other networks. Concrete examples of the foregoing include distribution of the programs on a CD ROM or via Internet download. In a sense, the Internet itself, as an abstract entity, is a computer readable medium. The same is true of computer networks in general. It is therefore to be understood that any electronic device capable of executing the above-described functions may perform those functions enumerated above.

Figure 7:
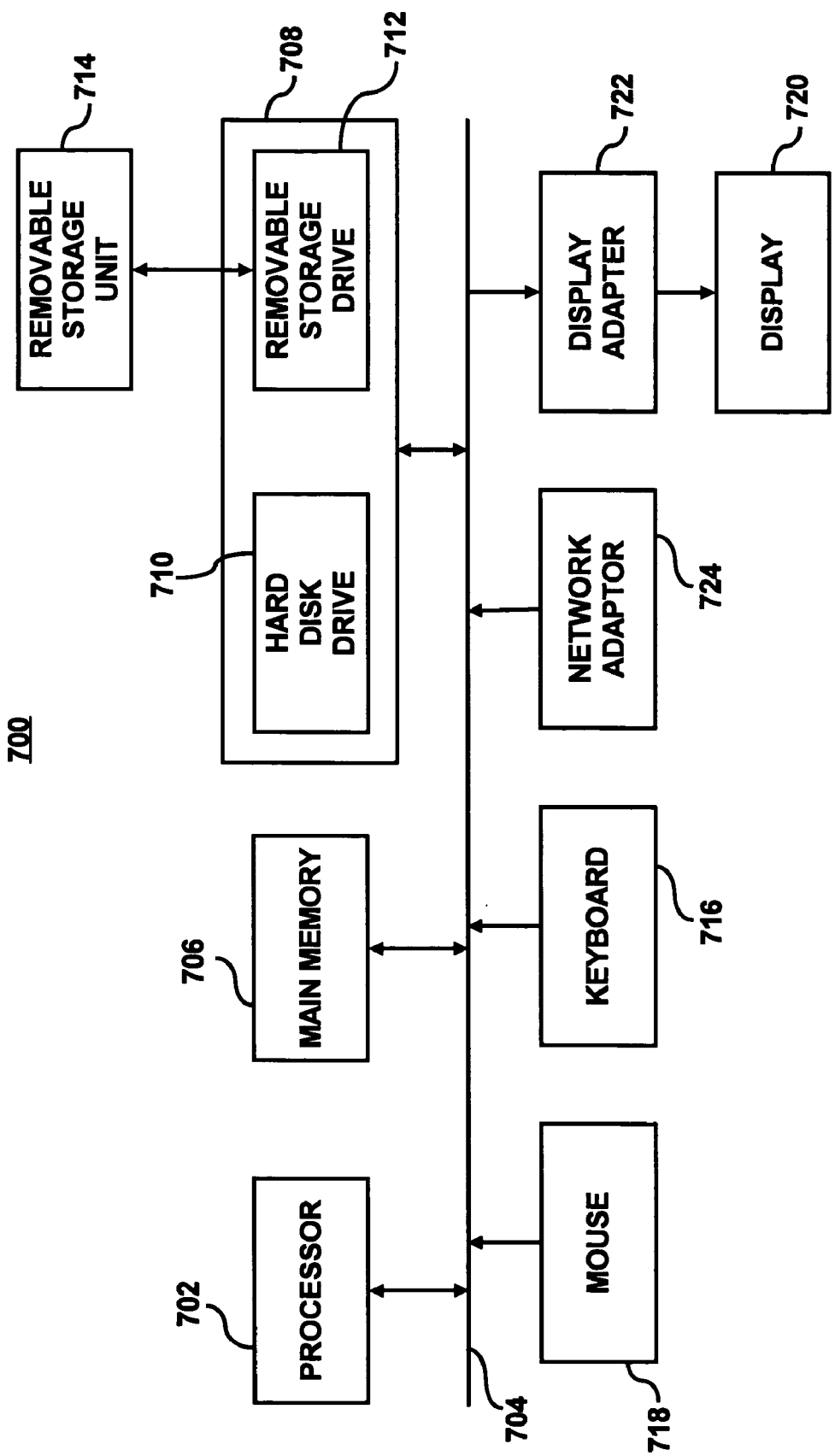
FIG. 7 illustrates an exemplary computer system capable of performing various operations described hereinabove with respect to FIGS. 3, 5, and 6.

FIG. 7 illustrates an exemplary computer system 700 capable of performing various operations described hereinabove with respect to FIGS. 3, 5, and 6. The computer system 700 may include, for example, the controller 204 and/or the computing device 126. In this respect, the computer system 700 may be used as a platform for executing one or more of the functions described hereinabove.

The computer system 700 includes one or more controllers, such as a processor 702. The processor 702 may be used to execute some or all of the steps described in the operational modes 300, 500, and 600. Commands and data from the processor 702 are communicated over a communication bus 704. The computer system 700 also includes a main memory 706, such as a random access memory (RAM), where the program code for, for instance, the controller 204 and/or the controller of the computing device 126, may be executed during runtime, and a secondary memory 708. The secondary memory 708 includes, for example, one or more hard disk drives 710 and/or a removable storage drive 712, representing a floppy diskette drive, a magnetic tape drive, a compact disk drive, etc., where a copy of the program code for the provisioning system may be stored.

The removable storage drive 710 reads from and/or writes to a removable storage unit 714 in a well-known manner. User input and output devices may include a keyboard 716, a mouse 718, and a display 720. A display adaptor 722 may interface with the communication bus 704 and the display 720 and may receive display data from the processor 702 and convert the display data into display commands for the display 720. In addition, the processor 702 may communicate over a network, e.g., the Internet, LAN, etc., through a network adaptor 724.

It will be apparent to one of ordinary skill in the art that other known electronic components may be added or substituted in the computer system 700. In addition, the computer system 700 may include a system board or blade used in a rack in a data center, a conventional "white box" server or computing device, etc. Also, one or more of the components in FIG. 7 may be optional (e.g., user input devices, secondary memory, etc.).

What has been described and illustrated herein is a preferred embodiment of the invention along with some of its variations. The terms, descriptions and figures used herein are set forth by way of illustration only and are not meant as limitations. Those skilled in the art will recognize that many variations are possible within the spirit and scope of the invention, which is intended to be defined by the following claims—and their equivalents—in which all terms are meant in their broadest reasonable sense unless otherwise indicated.

What is claimed is:

1. A method for evaluating one or more components in a data center, the method comprising:
   detecting inlet and outlet temperatures of one or more heat dissipating devices;
   detecting temperatures of air supplied by one or more computer room air conditioning (CRAC) units;
   calculating indices of air re-circulation for the one or more heat dissipating devices based upon the detected inlet temperatures, outlet temperatures and supplied air temperatures;
   varying a flow field setting of air delivered to the one or more heat dissipating devices;
   determining whether the indices of air re-circulation has changed in response to the varied flow field settings; and
   evaluating the one or more components based upon changes in the indices of air re-circulation for the one or more heat dissipating devices at the various flow field settings.

2. The method according to claim 1, wherein the step of varying a flow field setting comprises varying at least one of a volume flow rate of air supplied by one or more CRAC units, at least one characteristic of air supplied through one or more vent tiles, and at least one characteristic of air returned through one or more return vent tiles.

3. The method according to claim 1, further comprising:
   comparing the indices of air re-circulation with respective inlet temperatures of the one or more heat dissipating devices; and
   determining relationships between the indices of air re-circulation and the respective inlet temperatures of the one or more heat dissipating devices at the varied volume flow field settings.

4. The method according to claim 3, further comprising:
   plotting the indices of air re-circulation with respective inlet temperatures of the one or more heat dissipating devices based upon differing levels of flow field settings, wherein the step of determining relationships comprises determining whether the plots indicate that a nearly linear relationship exists between the plotted indices of air re-circulation and respective inlet temperatures of the one or more heat dissipating devices.

5. The method according to claim 4, further comprising:
   indicating that an infrastructure of the data center is substantially optimized in response to the plots indicating that a nearly linear relationship exists; and
   indicating that the infrastructure of the data center is not substantially optimized in response to the plots indicating that a nearly linear relationship does not exist.

6. The method according to claim 1, wherein the indices of air re-circulation are supply heat indices and are defined by the following equation:

$$SHI = \left(\frac{T_{in} - T_{ref}}{T_{out} - T_{ref}}\right)$$

wherein, $T_{in}$ and $T_{out}$ are the inlet and outlet temperatures of one of the one or more heat dissipating devices, and $T_{ref}$ denotes the supply air temperatures of one or more of the CRAC units.

7. The method according to claim 1, further comprising: designing a substantially optimized layout of the data center based upon the step of evaluating the one or more components.

8. The method according to claim 1, further comprising: determining various flow field settings; comparing the indices of air re-circulation at the various flow field settings for at least one of the one or more heat dissipating devices; and determining whether the indices of air re-circulation have changed for the various flow field settings for the at least one of the one or more heat dissipating devices.

9. The method according to claim 8, wherein the flow field settings comprise volume flow rates of one or more CRAC units, and wherein the step of evaluating the one or more components comprises outputting an indication that the at least one of the one or more heat dissipating devices is not influenced by at least one of the one or more CRAC units in response to the indices of air re-circulation being substantially the same for the various volume flow rates for the at least one of the one or more heat dissipating devices; and wherein the step of evaluating the one or more components comprises outputting an indication that the at least one of the one or more heat dissipating devices is influenced by at least one of the one or more CRAC units in response to the indices of air re-circulation changing for the various volume flow rates for the at least one of the one or more heat dissipating devices.

10. The method according to claim 9, further comprising: determining a level of influence of at least one of the one or more CRAC units in response to a determination that the at least one of the one or more heat dissipating devices is influenced by at least one of the one or more CRAC units.

11. The method according to claim 8, further comprising: varying one or more of the flow field settings in response to the indices of air re-circulation being substantially the same for the various one or more flow field settings for the at least one of the one or more heat dissipating devices; determining the air re-circulation index of the at least one of the one or more heat dissipating devices; and determining whether the indices of air re-circulation have changed for the various flow field settings for the at least one of the one or more heat dissipating devices.

12. The method according to claim 11, further comprising: determining the level of change in the air re-circulation index of at least one of the one or more heat dissipating devices in response to a determination that the air re-circulation index of the at least one of the one or more heat dissipating devices has changed; correlating the level of change in the air re-circulation index of the at least one of the one or more heat dissipating devices to an airflow characteristic of the at least one of the one or more heat dissipating devices.

13. A computational fluid dynamics (CFD) tool for evaluating one or more components in a data center, said CFD tool comprising:
a modeling program configured to obtain inlet and outlet temperatures of one or more heat dissipating devices and temperatures of air supplied by one or more computer room air conditioning (CRAC) units based upon at least one of input by a user and through a calculation of airflow characteristics in the data center;
wherein the modeling program is further configured to calculate indices of air re-circulation of the one or more heat dissipating devices based upon the inlet and outlet temperatures of one or more heat dissipating devices and temperatures of air supplied by one or more CRAC units, the modeling program being further configured to calculate the indices of air re-circulation of the one or more heat dissipating devices at various flow field settings of air delivered to the one or more heat dissipating devices; and
wherein the modeling program is further configured to evaluate the one or more components based upon changes in the indices of air re-circulation of the one or more heat dissipating devices.

14. The CFD tool according to claim 13, wherein the modeling program is further configured to compare the indices of air re-circulation with respective inlet temperatures of the one or more heat dissipating devices and to determine relationships between the indices of air re-circulation and the respective inlet temperatures of the one or more heat dissipating devices at the various flow field settings, said modeling program being further configured to plot the indices of air re-circulation with respective inlet temperatures of the one or more heat dissipating devices based upon the various flow field settings.

15. The CFD tool according to claim 14, wherein the modeling program is further configured to determine whether a near linear relationship exists between the plotted indices of air re-circulation and respective inlet temperatures of the one or more heat dissipating devices at the various flow field setting, and wherein the modeling program is further configured to indicate that an infrastructure of the data center is substantially optimized in response to a determination that a near linear relationship exists and to indicate that the infrastructure of the data center is not substantially optimized in response to a determination that a nearly linear relationship does not exist.

16. The CFD tool according to claim 13, wherein the modeling program is further configured to design a substantially optimized layout of the data center.

17. The CFD tool according to claim 13, wherein the modeling program is further configured to determine various flow field settings, to compare the indices of air re-circulation at the various flow field settings for at least one of the one or more heat dissipating devices, and to determine whether the indices of air re-circulation have changed for the various volume flow field settings for the at least one of the one or more heat dissipating devices.

18. The CFD tool according to claim 17, wherein the various flow field settings comprise various volume flow settings of one or more CRAC units, and wherein the modeling program is further configured to output an indication that the at least one of the one or more heat dissipating devices is not influenced by at least one of the one or more CRAC units in response to the indices of air re-circulation being substantially the same for the various volume flow rates for the at least one of the one or more heat dissipating devices, and to output an indication that the at least one of the one or more heat dissipating devices is influenced by at least one of the one or more CRAC units in response to the indices of air re-circulation changing for the various volume flow rates for the at least one of the one or more heat dissipating devices.

19. The CFD tool according to claim 18, wherein the modeling program is further configured to determine a level of influence of at least one of the one or more CRAC units in response to a determination that the at least one of the one or more heat dissipating devices is influenced by at least one of the one or more CRAC units.

20. The CFD tool according to claim 17, wherein the modeling program is further configured to varying one or more of the flow field settings in response to the indices of air re-circulation being substantially the same for the various flow field settings for the at least one of the one or more heat dissipating devices, to determine the air re-circulation index of the at least one of the one or more heat dissipating devices; and to determine whether the indices of air re-circulation have changed for the various flow field settings for the at least one of the one or more heat dissipating devices.

21. The CFD tool according to claim 20, wherein the modeling program is further configured to determine the level of change in the air re-circulation index of at least one of the one or more heat dissipating devices in response to a determination that the air re-circulation index of the at least one of the one or more heat dissipating devices has changed and to correlate the level of change in the air re-circulation index of the at least one of the one or more heat dissipating devices to an airflow characteristic of the at least one of the one or more heat dissipating devices.

22. A system for evaluating one or more components in a data center, said system comprising:
one or more heat dissipating devices having respective inlet and outlet temperature sensors;
one or more computer room air conditioning (CRAC) units having respective supply air temperature sensors; and
a controller configured to calculate indices of air re-circulation for the one or more heat dissipating devices based upon temperatures detected by the inlet and outlet temperature sensors and the supply air temperature sensors at various volume flow field settings of air delivered to the one or more heat dissipating devices, wherein the controller is further configured to evaluate the one or more components in the data center based upon changes in the air re-circulation indices.

23. The system according to claim 22, wherein the controller is further configured to compare the indices of air re-circulation with respective inlet temperatures of the one or more heat dissipating devices and to determine relationships between the indices of air re-circulation and the respective inlet temperatures of the one or more heat dissipating devices at the various flow field settings, said controller being further configured to plot the indices of air re-circulation with respective inlet temperatures of the one or more heat dissipating devices based upon the various flow field settings.

24. The system according to claim 23, wherein the controller is further configured to determine whether a near linear relationship exists between the plotted indices of air re-circulation and respective inlet temperatures of the one or more heat dissipating devices at the various flow field settings, and wherein the controller is further configured to indicate that an infrastructure of the data center is substantially optimized in response to a determination that a near linear relationship exists and to indicate that the infrastructure of the data center is not substantially optimized in response to a determination that a nearly linear relationship does not exist.

25. The system according to claim 22, wherein controller is further configured to design a substantially optimized layout of the data center.

26. The system according to claim 22, wherein the controller is configured to calculate the indices of air re-circulation through the following equation:

$$SHI = \left( \frac{T_{in} - T_{ref}}{T_{out} - T_{ref}} \right)$$

wherein, SHI is defined as a supply heat index, $T_{in}$ and $T_{out}$ are the inlet and outlet temperatures of one of the one or more heat dissipating devices, and $T_{ref}$ denotes the supply air temperatures of one or more of the CRAC units.

27. The system according to claim 22, wherein the controller is further configured to determine various flow field settings, to compare the indices of air re-circulation at the various flow field settings for at least one of the one or more heat dissipating devices, and to determine whether the indices of air re-circulation have changed for the various flow field settings for the at least one of the one or more heat dissipating devices.

28. The system according to claim 27, wherein the various flow field settings comprise various volume flow rates of air supplied by one or more CRAC units, and wherein the controller is further configured to output an indication that the at least one of the one or more heat dissipating devices is not influenced by at least one of the one or more CRAC units in response to the indices of air re-circulation being substantially the same for the various volume flow rates for the at least one of the one or more heat dissipating devices, and to output an indication that the at least one of the one or more heat dissipating devices is influenced by at least one of the one or more CRAC units in response to the indices of air re-circulation changing for the various volume flow rates for the at least one of the one or more heat dissipating devices.

29. The system according to claim 28, wherein the controller is further configured to determine a level of influence of at least one of the one or more CRAC units in response to a determination that the at least one of the one or more heat dissipating devices is influenced by at least one of the one or more CRAC units.

30. The system according to claim 27, wherein the controller is further configured to varying one or more of the flow field settings in response to the indices of air re-circulation being substantially the same for the various flow field settings for the at least one of the one or more heat dissipating devices, to determine the air re-circulation index of the at least one of the one or more heat dissipating devices; and to determine whether the indices of air re-circulation have changed for the various flow field settings for the at least one of the one or more heat dissipating devices.

31. The system according to claim 30, wherein the controller is further configured to determine the level of change in the air re-circulation index of at least one of the one or more heat dissipating devices in response to a determination that the air re-circulation index of the at least one of the one or more heat dissipating devices has changed and to correlate the level of change in the air re-circulation index of the at least one of the one or more heat dissipating devices to an airflow characteristic of the at least one of the one or more heat dissipating devices.

32. A system for evaluating one or more components in a data center, said system comprising:
- means for detecting inlet and outlet temperatures of one or more heat dissipating devices;
- means for detecting temperatures of air supplied by one or more computer room air conditioning (CRAC) units;
- means for calculating indices of air re-circulation for the one or more heat dissipating devices at various flow field settings of air delivered to the one or more heat dissipating devices; and
- means for evaluating the one or more components based upon the calculated indices of air re-circulation at the various flow field settings.

33. The system according to claim 32, wherein the means for calculating comprises means for comparing the indices of air re-circulation with respective inlet temperatures of the one or more heat dissipating devices and means for determining relationships between the indices of air re-circulation and the respective inlet temperatures of the one or more heat dissipating devices at the varied flow field settings.

34. The system according to claim 32, further comprising:
- means for designing a substantially optimized layout of the data center based upon the step of evaluating the one or more components.

35. The system according to claim 32, further comprising:
- means for determining volume flow rates of air supplied by the one or more CRAC units;
- means for comparing the indices of air re-circulation at the various volume flow rates of air supplied by the one or more CRAC units for at least one of the one or more heat dissipating devices;
- means for determining whether the indices of air re-circulation have changed for the various volume flow rates for the at least one of the one or more heat dissipating devices; and
- means for outputting at least one of an indication and a level of influence of at least one of the one or more CRAC units over at least one of the one or more racks.

36. The system according to claim 32, further comprising:
- means for varying one or more of the flow field settings in response to the indices of air re-circulation being substantially the same for the various flow field settings for the at least one of the one or more heat dissipating devices;
- means for determining the air re-circulation index of the at least one of the one or more heat dissipating devices;
- means for determining whether the indices of air re-circulation have changed for the various flow field settings for the at least one of the one or more heat dissipating devices;
- means for determining the level of change in the air re-circulation index of at least one of the one or more heat dissipating devices in response to a determination that the air re-circulation index of the at least one of the one or more heat dissipating devices has changed; and
- means for correlating the level of change in the air re-circulation index of the at least one of the one or more heat dissipating devices to an airflow characteristic of the at least one of the one or more heat dissipating devices.

37. A computer readable storage medium on which is embedded one or more computer programs, said one or more computer programs implementing a method for evaluating one or more components in a data center, said one or more computer programs comprising a set of instructions for:
- detecting inlet and outlet temperatures of one or more heat dissipating devices;
- detecting temperatures of air supplied by one or more computer room air conditioning (CRAC) units;
- calculating indices of air re-circulation for the one or more racks at various flow field settings of air delivered to the one or more heat dissipating devices; and
- evaluating the one or more components based upon the calculated indices of air re-circulation at the various flow field settings.

38. The computer readable storage medium according to claim 37, said one or more computer programs further comprising a set of instructions for:
- comparing the indices of air re-circulation with respective inlet temperatures of the one or more heat dissipating devices; and
- determining relationships between the indices of air re-circulation and the respective inlet temperatures of the one or more heat dissipating devices at the varied flow field settings.

39. The computer readable storage medium according to claim 37, said one or more computer programs further comprising a set of instructions for:
- designing a substantially optimized layout of the data center based upon the step of evaluating the one or more components.

40. The computer readable storage medium according to claim 37, said one or more computer programs further comprising a set of instructions for:
- determining volume flow rates of air supplied by the one or more CRAC units;
- comparing the indices of air re-circulation at the various volume flow rates of air supplied by the one or more CRAC units for at least one of the one or more heat dissipating devices;
- determining whether the indices of air re-circulation have changed for the various volume flow rates for the at least one of the one or more heat dissipating devices; and
- outputting at least one of an indication and a level of influence of at least one of the one or more CRAC units over at least one of the one or more heat dissipating devices.

41. The computer readable storage medium according to claim 37, said one or more computer programs further comprising a set of instructions for:
- varying one or more of the flow field settings in response to the indices of air re-circulation being substantially the same for the various flow field settings for the at least one of the one or more heat dissipating devices;
- determining the air re-circulation index of the at least one of the one or more heat dissipating devices;
- determining whether the indices of air re-circulation have changed for the various flow field settings for the at least one of the one or more heat dissipating devices;
- determining the level of change in the air re-circulation index of at least one of the one or more heat dissipating devices in response to a determination that the air re-circulation index of the at least one of the one or more heat dissipating devices has changed; and
- correlating the level of change in the air re-circulation index of the at least one of the one or more heat dissipating devices to an airflow characteristic of the at least one of the one or more heat dissipating devices.

* * * * *